United States Patent
Nair et al.

(10) Patent No.: US 8,890,628 B2
(45) Date of Patent: Nov. 18, 2014

(54) ULTRA SLIM RF PACKAGE FOR ULTRABOOKS AND SMART PHONES

(75) Inventors: Vijay K. Nair, Mesa, AZ (US); Dale A. Hackitt, Mesa, AZ (US); Carlton E. Hanna, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/600,944

(22) Filed: Aug. 31, 2012

(65) Prior Publication Data

US 2014/0062607 A1   Mar. 6, 2014

(51) Int. Cl.
*H01L 41/053* (2006.01)
*H03H 9/10* (2006.01)

(52) U.S. Cl.
USPC ............................................. 331/68; 257/416

(58) Field of Classification Search
USPC ..................................... 331/68, 158; 257/416
See application file for complete search history.

(56) References Cited

U.S. PATENT DOCUMENTS

| | | | |
|---|---|---|---|
| 6,023,098 A | 2/2000 | Higashiguchi et al. | |
| 6,909,054 B2 | 6/2005 | Sakamoto et al. | |
| 7,538,627 B2 * | 5/2009 | Moriya ............................ | 331/68 |
| 8,232,845 B2 * | 7/2012 | Ruby et al. ....................... | 331/68 |
| 2004/0014317 A1 | 1/2004 | Sakamoto et al. | |
| 2008/0179717 A1 | 7/2008 | Wu | |
| 2009/0309202 A1 | 12/2009 | Hsu et al. | |

FOREIGN PATENT DOCUMENTS

| | | |
|---|---|---|
| JP | 2002-246756 | 8/2002 |
| JP | 2005-203997 A | 7/2005 |
| JP | 2005-317908 A | 11/2005 |
| JP | 2007-067773 A | 3/2007 |

OTHER PUBLICATIONS

International Search Report and Written Opinion mailed Dec. 26, 2013 for PCT/US2013/046394 filed Jun. 18, 2013.

* cited by examiner

*Primary Examiner* — Joseph Chang
(74) *Attorney, Agent, or Firm* — Blakely, Sokoloff, Taylor & Zafman LLP (57) ABSTRACT

A semiconductor device package having reduced form factor and a method for forming said semiconductor device are disclosed. In an embodiment, an active die is embedded within a cavity in the core layer of the package substrate, wherein an in-situ electromagnetic shield is formed on the sidewalls of the cavity. In another embodiment, a crystal oscillator is at least partially embedded within the core layer of the package substrate. In another embodiment, a package having a component embedded in the core layer is mounted on a PCB, and a crystal oscillator generating a clock frequency for the package is mounted on the PCB. By embedding components within the core or removing components from the package to be mounted directly on the PCB, the x, y, and z dimensions of a package may be reduced. In addition, in-situ electromagnetic shield may reduce EM noise emitted from the active die.

29 Claims, 10 Drawing Sheets

ULTRA SLIM RF PACKAGE FOR ULTRABOOKS AND SMART PHONES

BACKGROUND

Mobile, tablet, and ultrabook technologies require semiconductor device packages with increasingly reduced dimensions, also known as a small form factor. Package technologies have been developed to incorporate multiple components into a single package to reduce the system board space (x-y dimension) and board mounted height ("z-height"). Packages may include a package substrate, one or more active dies, a crystal oscillator, additional active and passive components, and encapsulation that may all contribute to the package x-y dimensions and z-height and limit the degree to which the package form factor can be reduced. Additionally, as package dimensions decrease and switching speeds increase, electromagnetic emissions may increase, increasing the need for strategies to reduce electromagnetic interference (EMI).

DETAILED DESCRIPTION

Embodiments of the present invention relate to a package structure having components embedded in the core of the package substrate to reduce the form factor and method of forming a package structure with a small form factor. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The x-y dimensions of a semiconductor device package are generally limited by the minimum surface area required to accommodate the mounting of passive and active components on the device surface of the package substrate. Additionally, the z-height is generally limited by the minimum height required to accommodate the tallest component mounted on the device surface.

In one aspect of the invention, embodiments enable the fabrication of a semiconductor device package with a reduced form factor in the x, y, and z directions by embedding an active die within an electromagnetically shielded cavity in the core layer of the package substrate. In a particular embodiment directed toward a mobile radio frequency (RF) device, a RF die is embedded within an electromagnetically shielded cavity in the core layer of a package substrate. Because the active die is embedded within the core layer, it does not require surface area on the surface of the package substrate, which may reduce the requirements for the x-y dimensions of the package. In addition, the embedded active die does not contribute to the z-height requirements of the package, as it might if mounted on the surface of the package substrate. As such, this approach can provide for reduced form factor in the x, y, and z directions. In addition, an in-situ electromagnetic shield, formed on all the sidewalls of the cavity in which the die is embedded, prevents electromagnetic (EM) noise generated by the embedded die from interfering with surrounding components of the package and/or the system level structure. Furthermore, the fabrication approach may improve system performance due to shorter interconnects between the radio transceiver IC and the RF device components.

In another aspect, embodiments of the invention enable the fabrication of a semiconductor device package with a reduced form factor in the x, y, and z directions by partially or fully embedding a crystal oscillator within the core layer of the package substrate. A crystal oscillator is a critical component of some packages, and substantial z-height can be required to accommodate taller crystals. Partially embedding the crystal in the package substrate—for example, in both the core layer and a portion of the buildup layers—reduces the impact that taller crystals have on the package z-height. Fully embedding the crystal in the package substrate can further reduce the impact that the crystal oscillator has on the package form factor. A fully embedded crystal oscillator does not require surface area on the device surface of the package substrate, and as such may enable reduction of the x-y dimensions of the package.

In another aspect, embodiments of the invention enable the fabrication of a semiconductor device package with a reduced form factor in the x, y, and z directions by mounting a crystal oscillator directly on the printed circuit board (PCB) to which the semiconductor device package is mounted. As explained above, a crystal oscillator can greatly impact the x, y, and z dimensions of a package. By removing the crystal from the package and mounting it directly on the PCB substrate, the package can be made to have a smaller form factor. The crystal may be connected to the package via internal routing in the PCB in order to generate the fundamental frequency for the clock signal. In addition, the impact of the crystal on the z-dimensions of the overall system board is reduced.

In another aspect, embodiments of the invention enable a method for fabricating a semiconductor device package with a reduced form factor in the x, y, and z directions by embedding a active die within an electromagnetically shielded cavity in the core layer of the package substrate and at least partially embedding a crystal oscillator within the core layer of the package substrate. In an embodiment, a core layer having a metal layer on each side is drilled to form a cavity within the core layer using mechanical drill or laser drill. A metal EM shield is plated on the sidewalls of the cavity. An active die is placed within the shielded cavity. A plurality of buildup layers are then formed on each side of the core layer. The buildup layers are patterned and plated to form vias interconnecting the conductive lines. A second cavity may then be drilled through a plurality of the buildup layers and the core layer, in which a crystal oscillator may be partially or fully embedded. Additional active and passive components may be mounted on the package surface, and then encapsulated in an overmold layer covered by a conformal EM shield.

Figure 1A:
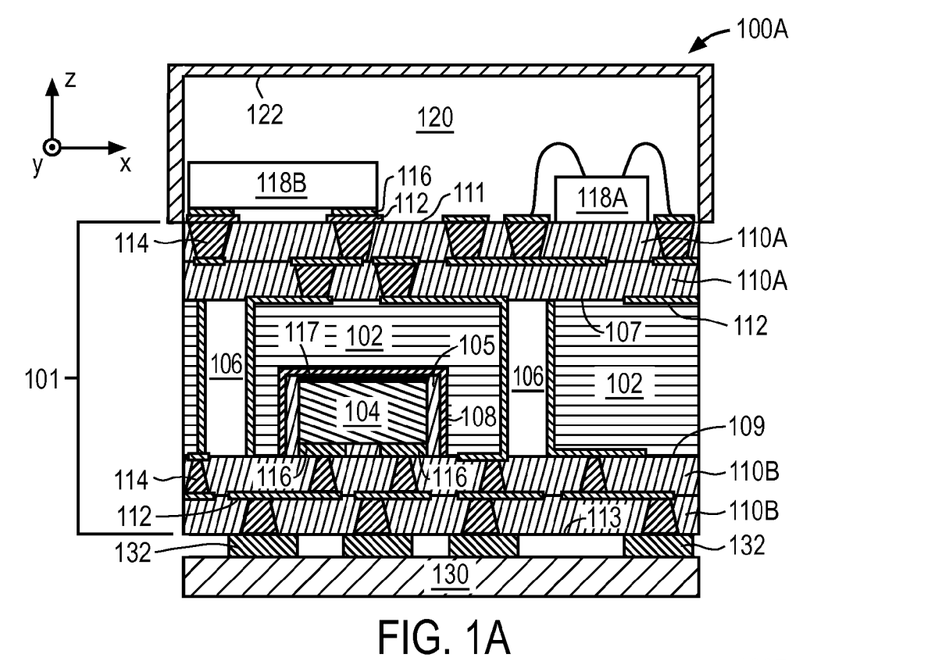
FIG. 1A illustrates a cross-sectional view of a package mounted on a PCB, where an active die is embedded in a shielded cavity in the core of the package, according to an embodiment of the invention.
Figure 1B:
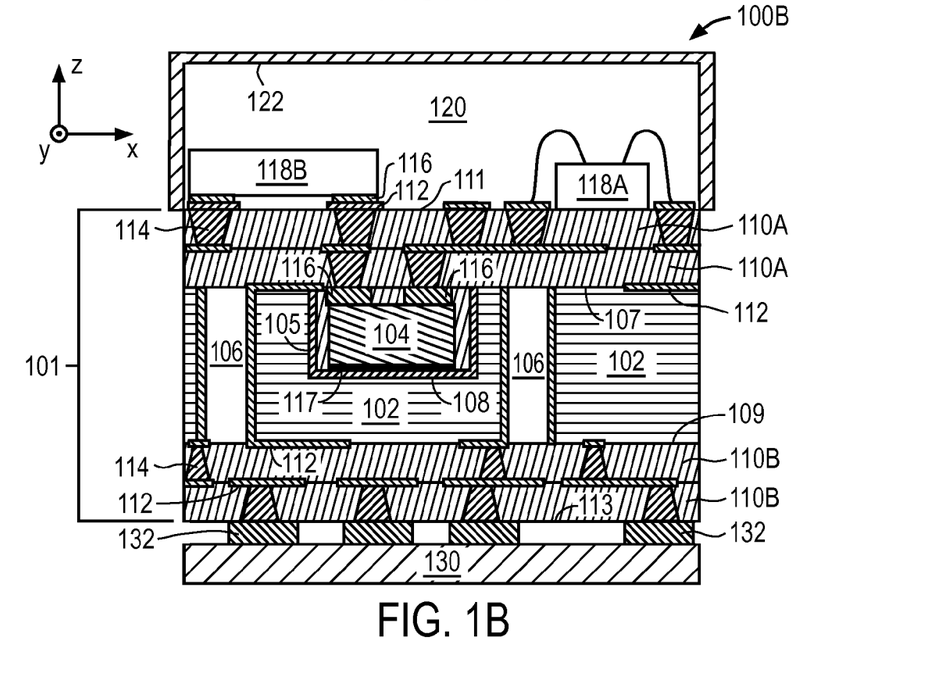
FIG. 1B illustrates a cross-sectional view of a package mounted on a PCB, where an active die is embedded in a shielded cavity in the core of the package, according to an embodiment of the invention.
Figure 1C:
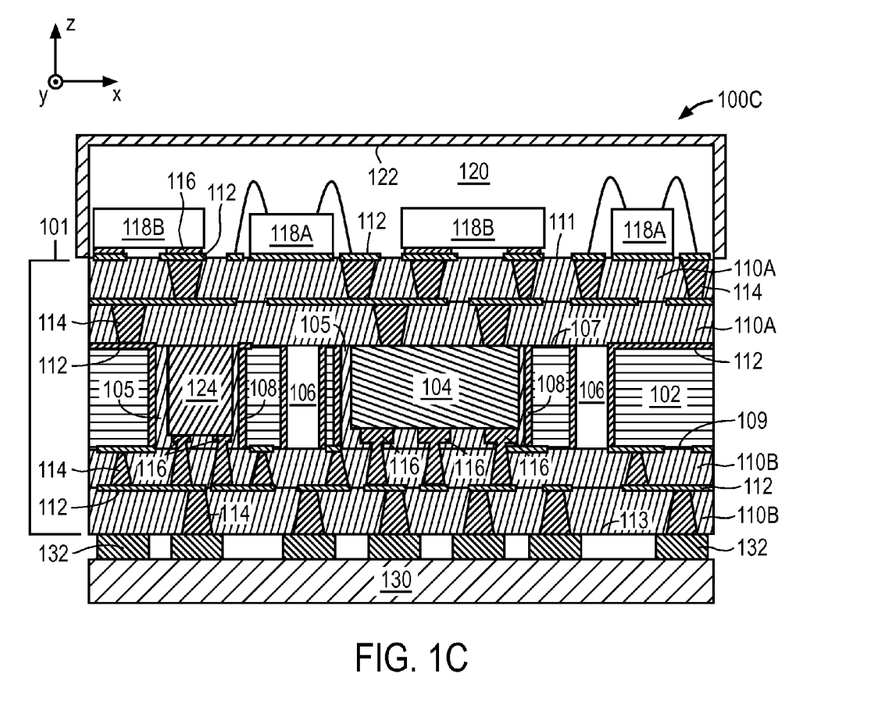
FIG. 1C illustrates a cross-sectional view of a package mounted on a PCB, where an active die is embedded in a shielded cavity in the core of the package, according to an embodiment of the invention.

FIGS. 1A-1C illustrate a semiconductor device package having an active die embedded in a shielded cavity in the core layer of the package substrate. Referring to FIG. 1A, a package 100A comprises package substrate 101 having a core layer 102. In an embodiment, active die 104 is embedded within core layer 102. In an embodiment, in-situ electromagnetic shield 108 is disposed between active die 104 and core layer 102. Core layer 102 may be a commercially available core using, for example, FR4, FR5, or organic materials such as bismaleimide triazine (BT). Other types of cores, such as a glass-reinforced epoxy with copper cladding, are within the purview of embodiments.

In an embodiment, core layer 102 has a device side 107 and a land side 109. Device side 107 faces the device surface 111 of package substrate 101. Device side 107 may also be called first side 107. Additional components 118A/118B may be mounted on device surface 111 of package substrate 101. In an embodiment, land side 109 of core layer 102 faces land surface 113 of package substrate 101. Land side 109 may also be called second side 109. In an embodiment, land surface 111 of package substrate 101 is mounted to PCB substrate 130 via conductive pads 132. In an embodiment, core layer 102 comprises plated through holes (PTH) 106, which communicate between the land side 109 and device mounting side 107. The PTH 106 are depicted in simplified form for illustrative purposes.

Cavity 105 in core layer 102 is sized to accommodate active die 104, according to an embodiment of the invention. The z-height of cavity 105 may be less than or equal to the z-height of core layer 102. In an embodiment where the z-height of the cavity 105 is less than the z-height of the core layer 102, as shown in FIGS. 1A and 1B, active die 104 is mounted within cavity 105 by die attach film (DAF) 117. Cavity 105 may be sized to accommodate the z-height of die DAF 117, active die 104 and conductive pads 116. By accommodating DAF 117 and die pads 116 in addition to the active die 104, die pads 116 are formed at the same level as conductive lines 112 formed on the surface of the core layer, so that vias 114 may connect to both the die pads 116 and the conductive lines 112, according to an embodiment. In an embodiment, an in-situ electromagnetic shield 108 is disposed between core layer 102 and active die 104. The in-situ electromagnetic shield 108 is provided to assist in sequestering local electromagnetic (EM) noise to areas that remain near the source of the noise. For example, electromagnetic shield 108 may reduce the amount of EM noise generated by the embedded active die 104 that radiates from cavity 105, so that signals communicating to devices 118A/118B disposed on the device surface 111 experience less EMI. In an embodiment, in-situ electromagnetic shield 108 is disposed on the sidewalls of the cavity 105. In-situ electromagnetic shield 108 may be any suitable conductive material. In an embodiment, in-situ electromagnetic shield 108 is copper.

Active die 104 may be any type of microelectronic die. In an embodiment, active die 104 is a radio frequency (RF) die. By embedding an active die within a cavity 105 in core layer 102, rather than mounting the die 104 on the device surface 111 of the package substrate 101, the z-height of the die 104 does not contribute to the z-height of package 100A. In addition, the embedded active die 104 does not require additional surface area on the device surface 111, enabling reduction of the x-y dimensions of package 100A. In an embodiment, active die 104 is secured within cavity 105 by DAF 117 on the bottom surface of active die 104. DAF 117 may be any suitable known die attach film. In an embodiment, the remaining space in cavity 105 between active die 104 and in-situ electromagnetic shield 108 is filled with buildup layer material, for example ABF.

A plurality of buildup layers 110A/110B cover each of the land side 107 and device side 109 of core layer 102, according to an embodiment of the invention. Buildup layers 110A/110B conform to conventional configurations for such layers as commonly used in multilayer substrates. In an embodiment, buildup layers 110A/110B have a configuration adapted to allow the routing of electricity/signals at various levels within the multilayer substrate as would be readily recognized by one of ordinary skill in the art. A variety of dielectric materials may be used to form buildup layers 110A/110B, as is known in the art, for example, ABF or polyimide.

In an embodiment, buildup layers 110A/110B contain conductive lines 112. In addition, each of the buildup layers 110A/110B contains vias 114 extending therethrough, in order to connect respective conductive lines 112 to one another. Conductive lines 112 and vias 114 are configured to allow the routing of electricity/signals at various levels within a multilayer substrate as would be readily recognized by one skilled in the art. In an embodiment, a via 114 contacts each conductive pad 116 on active die 104. It is to be understood that the number and location of conductive lines 112 and vias 114 is merely illustrative and more or less may be disposed within buildup layers 118A/118B even in the cross sectional view depicted. Conductive lines 112 and vias 114 are a suitable conductive material, for example, copper.

In an embodiment, the package substrate 101 is symmetric, wherein the number of land side buildup layers 110B is equal to the number of device side buildup layers 110A, as shown in FIG. 1A. In another embodiment, the package substrate 101 is asymmetric, wherein the number of land side buildup layers 110B is not equal to the number of device-side buildup layers 110A.

Conductive pads 116 electrically connect active die 104 to package routing including conductive lines 112 and vias 114, in accordance with some embodiments. In an embodiment, active die 104 is mounted on a land side buildup layer 110B, in a face-down configuration, as shown in FIG. 1A. In another embodiment, active die 104 is mounted on a device side buildup layer 110A, in a face-up configuration, as shown in FIG. 1B.

A plurality of surface devices 118A/118B are mounted on the device surface 111 of package substrate 101, according to an embodiment of the invention. Surface devices 118A/118B may be active or passive. A passive device may be, for example, a band pass filter, capacitor, inductor, resistor, or crystal oscillator for clock generation. An active device may be, for example, an RF die, an RF switch, an application processor, memory chip, or a power amplifier. In an embodiment, surface device 118A is wire bonded to conductive lines 112 on device surface 111. In another embodiment, surface device 118B is mounted by surface mount technology (SMT), such as flip chip assembly. For example, surface device 118B may be mounted via conductive pads 116 to conductive lines 112 on device surface 111. It is to be understood that the plurality of surface devices 118A/118B is merely illustrative and more or fewer than two, attached by any appropriate method, may be disposed on device surface 111 even in the cross-sectional view depicted.

In an embodiment, overmold layer 120 protects the at least one surface device 118A/118B disposed on device surface 111. The overmold layer 120 delivers multiple effects including at least protection of the at least one surface device and providing additional stiffness to package 100A. Overmold layer 120 may be any conventional molding compound used in packaging technologies. For example, the molding compound can be a thermosetting material such as, but not limited to, epoxy resin, phenolic resin, polyimide, and poly-benzoxasole (PBO). The molding compound may also be filled. In an embodiment, the molding compound comprises approximately 90% filler, such as silica particles.

In an embodiment, a conformal shield layer 122 covers overmold layer 120. In an embodiment, conformal metal shield 122 provides EM shielding of surface components 118A/118B. Conformal shield layer 122 may be any suitable conductive film or solution that can be coated on the surface of the overmold layer 120. In another embodiment, a detachable metal shield covers overmold layer 120.

Package 100A is mounted to PCB 130 via conductive pads 132. Conductive pads 132 may be used to electrically and mechanically connect package 100A to PCB 130 by known methods, for example, land grid array (LGA) or ball grid array (BGA). A plurality of conductive pads 132 is illustrated on land surface 113, but the number is small for illustrative simplicity. In an embodiment, PCB 130 is a daughter card that is to be placed on a motherboard of a mobile computing device such as a smart phone or ultrabook. Alternatively, PCB 130 may be the motherboard.

Referring to FIG. 1C, core layer 102 comprises at least two cavities 105, on containing embedded active device 104 and another containing additional component 124, according to an embodiment of the invention. In an example embodiment, the z-height of cavities 105 is equal to the z-height of core layer 102. Where a cavity 105 extends through the full z-height of core layer 102, an in-situ electromagnetic shield 108 is disposed on the sidewalls of cavity 105 between core layer 104 and additional component 124, according to an embodiment of the invention. In an embodiment, additional component 124 is a passive device. In another embodiment, additional component 124 is an active device. In an embodiment where additional component 124 generates EM noise, as shield 108 is formed on the sidewalls of the cavity 105 containing additional component 124, as shown in FIG. 1C. In another embodiment, such as where additional component 124 does not generate EM noise, a shield is not disposed between core layer 104 and additional component 124. In an embodiment, DAF is not used to secure either the active die or the additional component within a cavity 105, where cavity 105 extends through the full z-height of core layer 102.

Figure 2A:
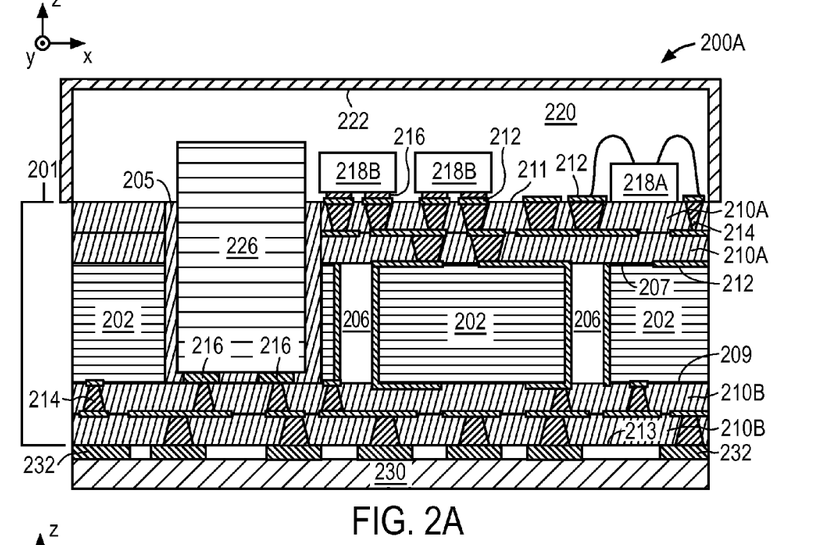
FIG. 2A illustrates a cross-sectional view of a package mounted on a PCB, where a crystal oscillator is embedded in the core of the package, according to an embodiment of the invention.
Figure 2B:
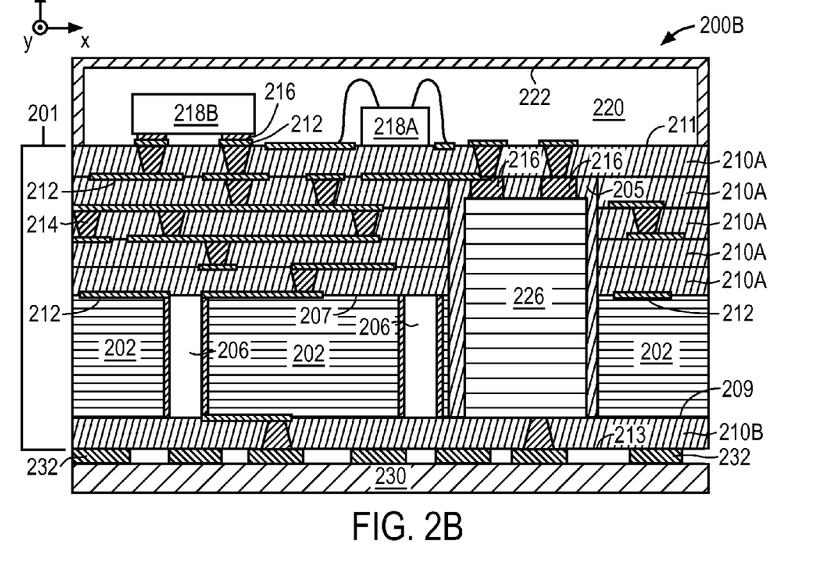
FIG. 2B illustrates a cross-sectional view of a package mounted on a PCB, where a crystal oscillator is embedded in the core of the package, according to an embodiment of the invention.
Figure 2C:
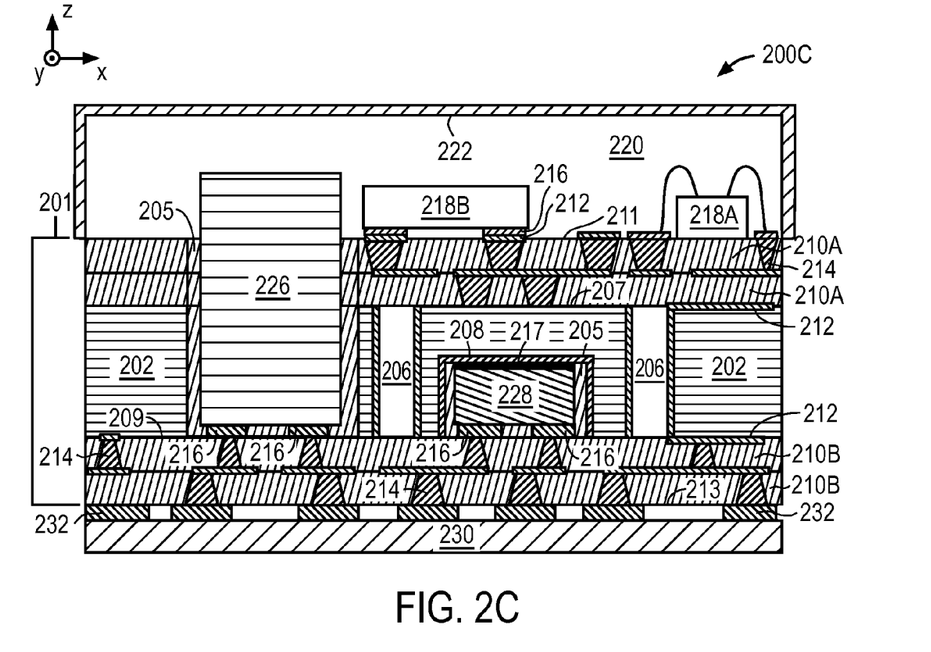
FIG. 2C illustrates a cross-sectional view of a package mounted on a PCB, where a crystal oscillator is embedded in the core of the package, according to an embodiment of the invention.

FIGS. 2A-2C illustrate a semiconductor device package having a crystal oscillator partially embedded in the core layer of the package substrate. Referring to FIG. 2A, crystal oscillator 226 is partially embedded in core layer 202 of package substrate 201, according to an embodiment of the invention. The properties of core layer 202 are the same as for core layer 102, discussed above. In an embodiment, core layer 202 has a device side 207, facing the device surface 211 of the package substrate 201 on which additional devices may be mounted, and a land side 209, facing the land surface 213 of the package substrate 201 that is mounted to PCB 230 via conductive pads 232.

A plurality of buildup layers 210A/210B are formed on each of the land side 209 and device side 207 of core layer 202, according to an embodiment of the invention. Though two device side buildup layers 210A and two land side buildup layers 210B are shown in the embodiment in FIG. 2A, other embodiments may have more or fewer buildup layers. For example, in an embodiment, the package substrate 201 is symmetric, wherein the number of land side buildup layers 210B is equal to the number of device side buildup layers 210A, as shown in FIG. 2A. In another embodiment, the package substrate 201 is asymmetric, wherein the number of land side buildup layers 210B is not equal to the number of device-side buildup layers 210A, as shown in FIG. 2B. A variety of dielectric materials may be used to form buildup layers 210A/210B. In an embodiment, buildup layers 210A/210B are polyimide.

In an embodiment, buildup layers 210A/210B contain conductive lines 212 and vias 214 having the properties of conductive lines 112 and vias 114, respectively, as discussed above. In an embodiment, core layer 202 additionally comprises PTH 206 to connect the device side 207, having device-side buildup layers 210A disposed thereon, to the land side 209, having land-side buildup layers 210B disposed thereon.

In an embodiment, crystal oscillator 226 is partially embedded within a cavity 205 formed in package substrate 201. In an embodiment, cavity 205 extends through core layer 202 and buildup layers 210A. In another embodiment, cavity 205 is formed in one or more land side buildup layers 210B, and extends through both the core layer 202 and device side buildup layers 210A, to device surface 211.

Crystal oscillator 226 is a conventional crystal oscillator that may be used in the generation of a clock signal for a semiconductor device, as is known in the art. In an embodiment, crystal oscillator 226 is partially embedded in core layer 202, extends through device side buildup layers 210A, and protrudes through from the device surface 211. In an embodiment, the z-height of package 200A is reduced by the amount of the height of crystal oscillator 226 that is embedded within package substrate 201. The reduction in z-height due to embedding crystal oscillator 226 may be limited by other factors, for example by the height of surface devices 218A/218B. In an embodiment, crystal oscillator 226 is connected to the package via conductive pads 216. connect Crystal oscillator 226 may be connected to one or more surface devices 218A/218B by conductive routing within the package, for example conductive lines 212 and vias 214. In an embodiment, crystal oscillator 226 is mounted on a land side buildup layer 210B. The space remaining between crystal oscillator 226 and the sidewalls of cavity 205 may be filled with an encapsulation material.

A plurality of surface devices 218A/218B are mounted on the device surface 211 of package substrate 201, according to an embodiment of the invention. Surface devices 218A/218B may be active or passive devices. In an embodiment, surface device 218A is wire bonded to conductive lines 212 on device surface 211. In another embodiment, surface device 218B is mounted by SMT, such as flip chip attachment. For example, surface device 218B may be mounted to device surface 211 via conductive pads 216 on conductive lines 212.

In an embodiment, overmold layer 220 encapsulates surface devices 218A/218B. In an embodiment, a conformal shield layer 222 is formed over overmold layer 220. The properties of overmold layer 220 and conformal shield layer 222 are the same as for overmold layer 120 and conformal shield layer 122, respectively, as discussed above. In an embodiment, overmold layer 220 and conformal metal shield 222 provide mechanical protection and EMI shielding of surface components 218A/218B.

Referring now to FIG. 2B, in another example embodiment, crystal oscillator 226 is fully embedded within package substrate 201 of package 200B. In an embodiment, crystal oscillator 226 is fully within a cavity 205 formed in core layer 202 and a plurality of device side buildup layers 210A. It is to be appreciated that, in order to fully embed crystal oscillator 226 in package substrate 201, cavity 205 may also be formed in one or more land side buildup layers 210B, core layer 202, and one or more device side buildup layers 210A, or in one or more land side buildup layers 210B and core layer 202.

Crystal oscillator 226 is mounted via conductive pads 216, according to an embodiment of the invention. In an embodiment, conductive pads 216 connect crystal oscillator 226 to a device side buildup layer 210A. In another embodiment, conductive pads 216 connect crystal oscillator 226 to a land side buildup layer 210B. By fully embedding crystal oscillator 226 within package substrate 201, crystal oscillator 226 does not occupy surface area on device surface 211, potentially reducing the minimum x-y dimension requirements for package 200B.

FIG. 2C illustrates another example embodiment, where in addition to crystal oscillator 226, component 228 is also embedded in a cavity 205 within core layer 202 of package 200C. In an embodiment where the z-height of cavity 205 is less than the z-height of core layer 202, a DAF film 217 is used to mount component 228 within cavity 205. In an embodiment, additional component 228 is fully embedded within core layer 202. In another embodiment, additional component 228 is partially embedded in core layer 202, and partially embedded in buildup layers 210A/210B. Additional component 228 may also protrude from device surface 211. By embedding additional component 228 at least partially within core layer 202, additional component 228 does not contribute to additional z-height of package. Further, in an embodiment, additional device 228 does not occupy area on surface 211, and as such, may enable reduction in the x-y dimensions of package 200C. In an embodiment, additional component 228 is a passive device. In another embodiment, additional component 228 is an active device, such as an RF die. Additional component 228 may or may not be shielded by in-situ electromagnetic shield 208.

Figure 3:
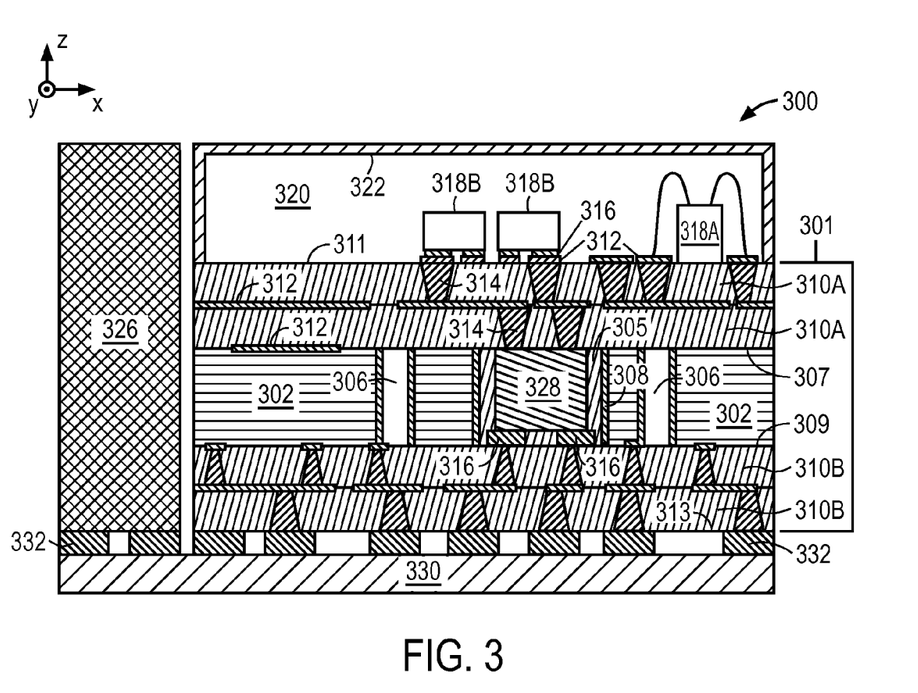
FIG. 3 illustrates a cross-sectional view of a crystal oscillator and a package each mounted to a PCB, where the package has an active device embedded in the core, according to an embodiment of the invention.

Referring to FIG. 3, a component 328 is mounted within the core layer 302 of package substrate 301, and crystal oscillator 326 is mounted directly on PCB 330, according to an embodiment of the invention. In an embodiment, package substrate 301 comprises core layer 302 and buildup layers 310A/310B, and has a device surface 311 and a land surface 313. Core layer 302 has a device side 307 and land side 309. In an embodiment, device side buildup layers 310A are formed over the device side 307, and land side buildup layers 310B are formed over the land side 309. In an embodiment, buildup layers 310A/310B comprise conductive lines 312 and vias 314 to route signals and power throughout package 300. In an embodiment, core layer 302 has PTH 306, which connect land side 309 to device side 307.

In an embodiment, component 328 is fully embedded within core layer 302. In another embodiment, component 328 is partially embedded within core layer 302 and partially embedded within buildup layers 310A/310B. Component 328 may be an active or passive device. Additionally, an electromagnetic shield may optionally be formed on the sidewalls of cavity 305 in which component 328 is embedded.

Package 300 comprises package substrate 301, surface devices 318A/318B mounted on device surface 311, overmold layer 320 encapsulating device surface 311 and surface devices 318A/318B, and a conformal shield 322 covering overmold layer 320, according to an embodiment of the invention. In an embodiment, surface device 318A is mounted to device surface 311 via wire bonding to conductive lines 312. Surface devices 318B may be mounted by surface mount technology, for example, via conductive pads 316 on conductive lines 312. In an embodiment, package 300 is mounted to PCB 330 via conductive pads 332. PCB 330 may be the motherboard of a system, or it may be a daughter card to be mounted on a motherboard.

In an embodiment, crystal oscillator 326 is mounted on PCB 330 via conductive pads 332. By mounting crystal oscillator 326 directly on the PCB 330, and not on the package substrate 301, the z-height of the package 300 does not need to accommodate the z-height of crystal 326. In an embodiment, the z-height of the package 300 may be reduced to less than the height of the crystal oscillator 326. The x-y dimensions of the package 300 may also be reduced without the need to accommodate the crystal oscillator 362. In an embodiment, crystal oscillator 326 is connected to package 300 via routing (not shown) in PCB 330.

Figure 4A:
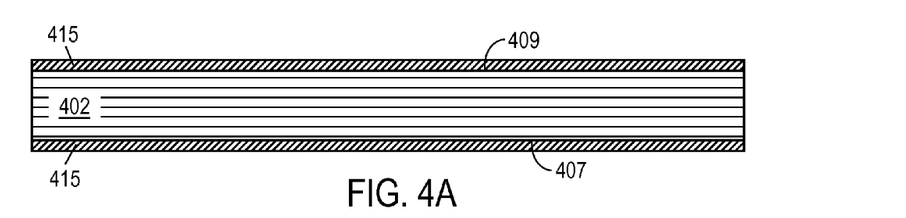
FIGS. 4A-4I illustrate cross-sectional views of a method for forming a package having an embedded die and embedded crystal oscillator, according to an embodiment of the invention.

FIGS. 4A-4I illustrate a method for forming reduced form factor packages having an active die embedded in a shielded cavity in the core layer and crystal oscillator also embedded in the core layer of the package substrate, according to an embodiment of the invention. In FIG. 4A, a core layer 402 is provided, according to an embodiment. Core layer has a device side 407 and a land side 409. Core layer 402 may be formed from any appropriate material, such as those described above with respect to core layer 102. In an embodiment, metal layers 415 are plated onto each of device side 407 and land side 409. Metal layers 415 may be electrolessly or electrolytically plated. In another embodiment, metal layers 415 are laminated onto the surface of core layer 402 using a metal foil. Metal layers 415 may be formed from any suitable conductive material, such as copper.

Figure 4B:
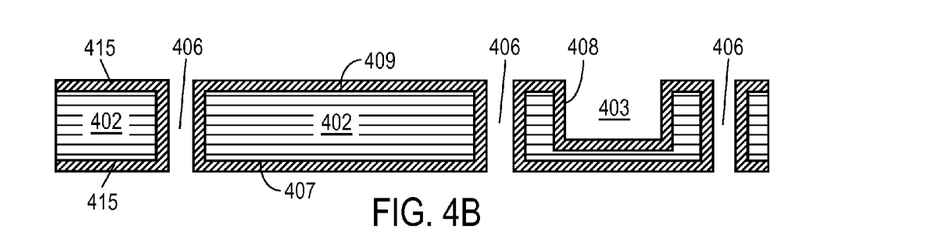

In FIG. 4B, PTH 406 are formed in core layer 402 and metal layers 415, according to an embodiment. PTH 406 may be formed by any suitable method, such as laser drilling or mechanical drilling. In an embodiment, PTH 406 are plated to enable electrical connection of elements on opposing sides of the core layer 402. PTH 406 may be plated by an electroless or electrolytic plating processes. PTH 406 may be plated with any appropriate conductive material, such as copper.

A cavity 405 is formed in core layer 402, according to an embodiment. Cavity 405 may be formed by any suitable method, such as laser drilling or mechanical drilling. In an embodiment, the volume and shape of cavity 405 is selected to fully accommodate an active die. In another embodiment, the volume and shape of cavity 405 is selected to accommodate a portion of an active die. In an embodiment, cavity 405 is open to the land side 409 to enable embedding a face-down active die. In another embodiment, cavity 405 is open to the device side 407 to enable embedding of a face-up active die. Additional cavities may be formed within core layer 402 to accommodate additional embedded active or passive devices.

In-situ electromagnetic shield 408 is formed on the sidewalls of cavity 405, according to an embodiment. In-situ electromagnetic shield 408 may be any appropriate material, as discussed above with respect to in-situ electromagnetic shield 108. In an embodiment, in-situ electromagnetic shield 408 is plated on the sidewalls of cavity 405, for example, by an electroless or electrolytic plating process. In-situ electromagnetic shield 408 is formed to a thickness sufficient to reduce the amount of EM noise produced by active die 404 that reaches outside of cavity 405.

Figure 4C:
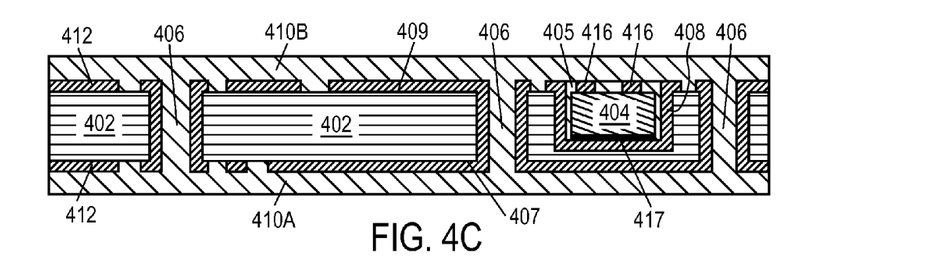
Figure 4D:
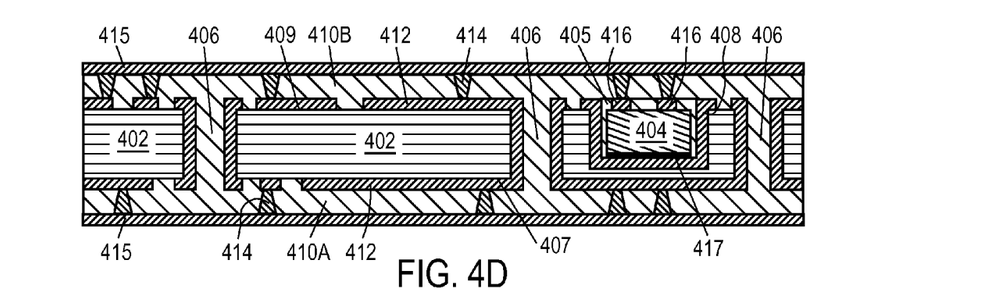

Referring to FIG. 4C, metal layers 415 are patterned to form conductive lines 412, according to an embodiment of the invention. It is to be appreciated that the layout of conductive lines 412 will vary depending on a particular package design.

An active die 404 is mounted within cavity 405, according to an embodiment. In an embodiment, a die attach film (DAF) 417 is formed on the bottom surface of active die 404 before placing the active die 404 within cavity 405, and curing the DAF 417 by thermal treatment to mount the die within the cavity. In an embodiment, conductive pads 416 have been formed on the die face during fabrication of active die 404; conductive pads 416 may be used to electrically connect active die 404 to the package.

In another embodiment, where the cavity 405 extends through the full thickness of core layer 402, active die 404 may be mounted within cavity 405 by first mounting the bottom surface of active die 404 on a temporary tape. Then, in an embodiment, the active die 404 is placed within the cavity 405, and a build up layer is laminated on the top side of the core layer 402, filling the cavity 405 and holding the active die 404 intact. The temporary tape may then removed.

Next, device side buildup layer 410A is formed on device side 407, and land side buildup layer 410B is formed on land side 409 of core layer 402. In an embodiment, the space remaining between active die 404 and in-situ electromagnetic shield 408 may be filled with buildup layer material. A variety of materials and processes may be used to form buildup layers 410A/410B. In one embodiment, buildup layers 410A/410B are laminated over conductive lines 412 and core 402. Buildup layers 410A/410B are then patterned to form openings for vias 414, as shown in the embodiment illustrate in FIG. 4D. In an embodiment, openings for vias 414 are formed in buildup layer 410B to expose conductive pads 414 on active die 404. In an embodiment, buildup layers 410A/410B are formed from ABF. In another embodiment, a photosensitive polyimide is used to form buildup layers 410A/410B. In such an embodiment, the photosensitive polyimide is cured by UV irradiation after patterning to form openings for vias 414. Metal layers 415 are then plated over the surfaces of buildup layers 410A/410B containing vias 414 to form the next level of connective lines 412.

Figure 4E:
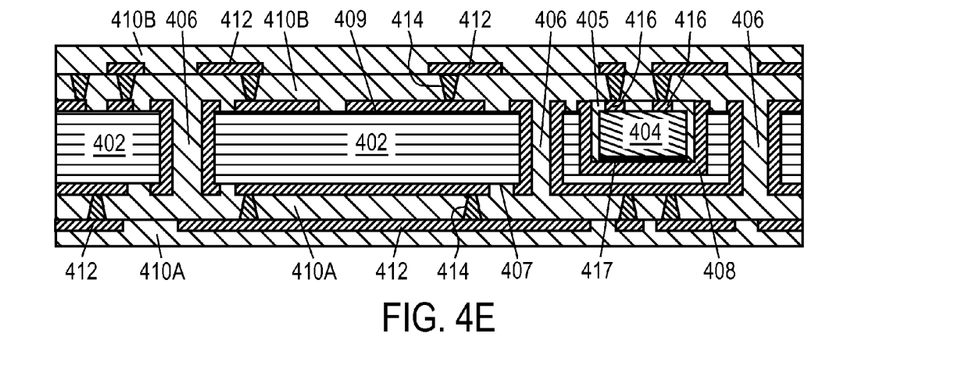
Figure 4F:
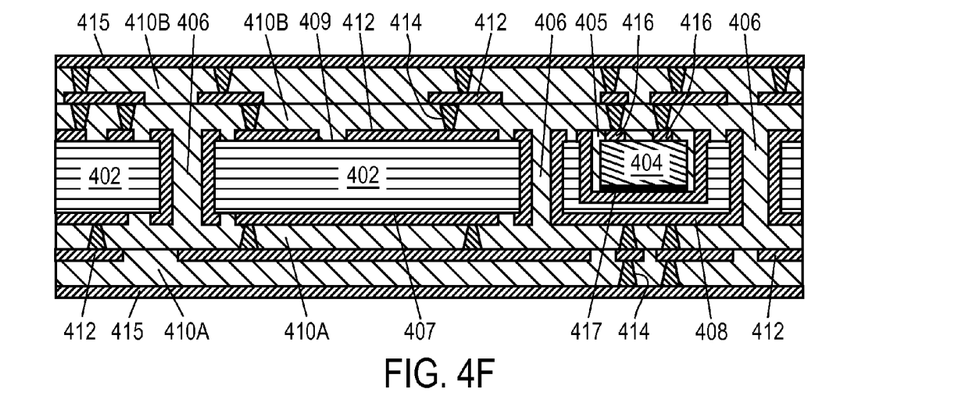

FIGS. 4E-4F illustrate the formation of an additional pair of buildup layers 410A/410B, according to an embodiment of the invention. In another embodiment, more or fewer buildup layers may be formed. For example, metal layers 415 are patterned to form conductive lines 412, another pair of dielectric buildup layers 410A/410B are formed over each surface and then patterned to form vias 414, and then both vias 414 and an additional set of metal layers 415 are plated and patterned into a third layer of conductive lines 412.

Figures 4G, 4H:
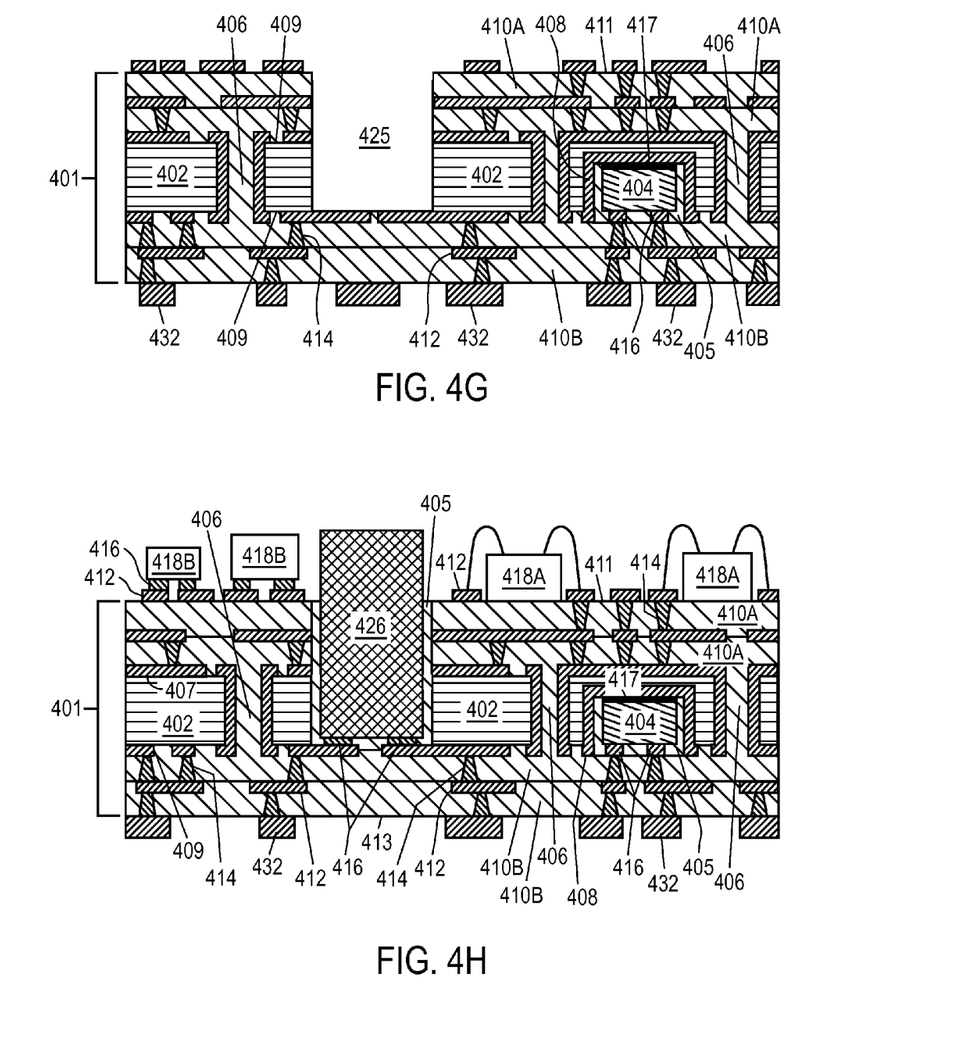

Then, a second cavity 425 may be formed in package substrate 401, according to an embodiment of the invention. Referring to FIG. 4G, the view of substrate 401 has been rotated as compared to FIG. 4F, so that the device surface 411 is at the top of the figure, while the land surface 413 is at the bottom. In an embodiment, second cavity 425 is drilled through device side buildup layers 410A and through core layer 402 to expose a land side buildup layer 410B. Second cavity 425 may be laser drilled or mechanically drilled. In addition, conductive pads 432 have been formed on land surface 413, which may be used to attach the package to a PCB via LGA or BGA, according to an embodiment of the invention.

In FIG. 4H, a crystal oscillator 426 is mounted within the second cavity 425, according to an embodiment of the invention. In an embodiment, the z-height of the crystal oscillator 426 is taller than the depth of the second cavity 425, so that crystal oscillator 426 protrudes from the device side 411 of package substrate 401. In an embodiment, partially embedding crystal oscillator 426 in package substrate 401 enables reduction of the package z-height. In another embodiment, the z-height of crystal oscillator 426 is less than the depth of the second cavity 425, and additional buildup layers 410A may be formed over the second cavity 425 so that crystal oscillator 426 is fully embedded in the package substrate 401. In an embodiment, fully embedding crystal 425 does not require surface area on the device surface 411 of the package substrate 401, enabling reduction of the x-y dimensions of the package. In another embodiment, the crystal oscillator 425 is not embedded within the package substrate 401, but rather mounted directly on the PCB, correspondingly enabling reduction of the package form factor.

Next, surface components 418A/418B are mounted on the device surface 411 of package substrate 401. The surface components 418A/418B may be active or passive. In an embodiment, a surface component 418A is wire bound to device surface 411. In an embodiment, a surface component 418B is attached using flip-chip bonding.

Figure 4I:
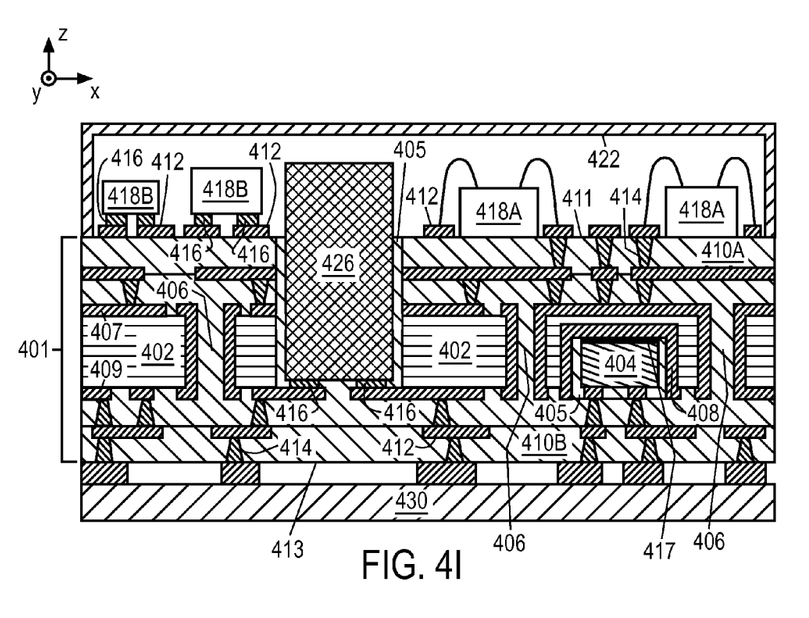

Then, as shown in FIG. 4I, the device surface 411 of the package substrate 401 is encapsulated with a molding material to form overmold layer 420. Overmold layer 420 may be any molding compound utilized in packaging technologies, and may be applied in a variety of manners including spin coating, injection molding, compression molding, and transfer molding. In an embodiment, the molding compound is fully cured to solidify overmold layer 420. In an embodiment, a conformal metal shield 422 may then be formed over the top of overmold layer 420. In an embodiment, overmold layer 420 and conformal metal shield 422 provide mechanical protection and EMI shielding of surface components 418A/418B.

The completed package may then be mounted to a PCB 430 via conductive pads 432. For example, the PCB 430 can be a daughter card which is to be placed on a motherboard of a mobile computing device such as a smart phone or ultrabook. Alternatively, the PCB 430 may be the motherboard.

Figure 5:
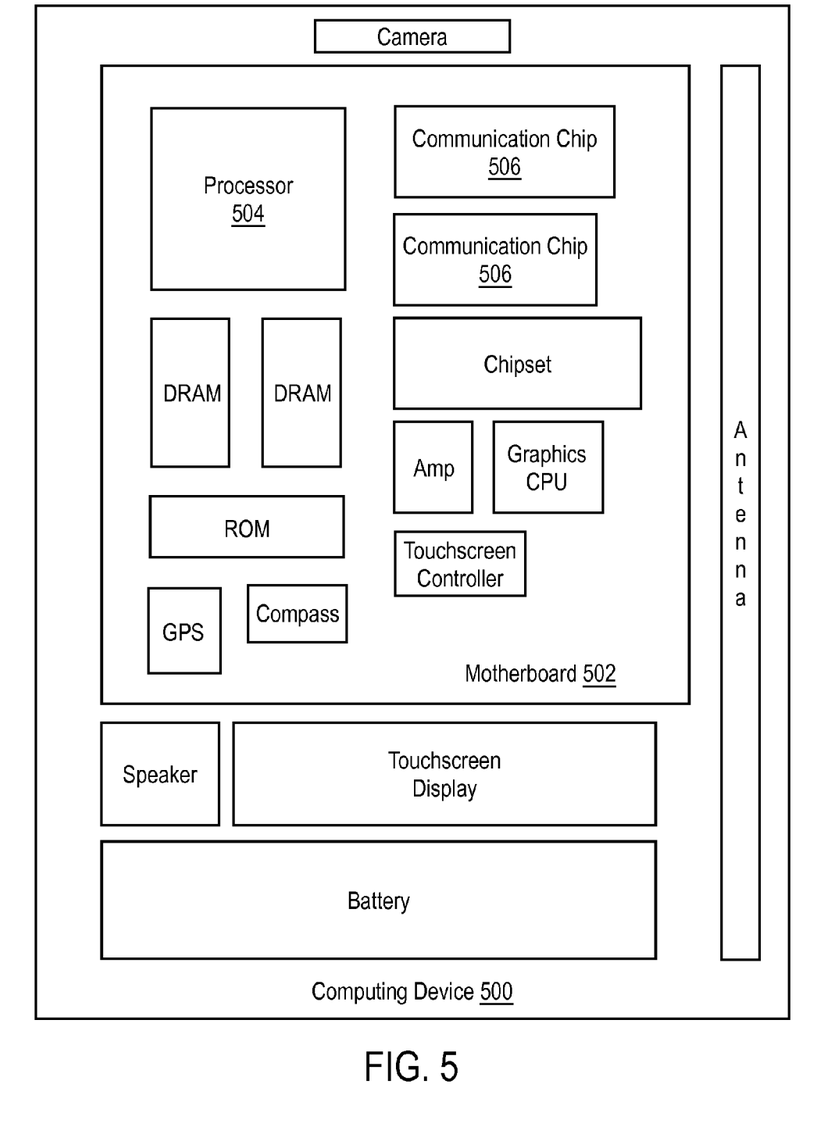
FIG. 5 illustrates a computing system implemented with one or more transistor structures in accordance with an example embodiment of the present invention.

FIG. 5 illustrates a computing device 500 in accordance with one implementation of the invention. The computing device 500 houses a board 502, which may be a circuit board such as a motherboard. The board 502 may include a number of components, including but not limited to a processor 504 and at least one communication package 506 that may be any of the semiconductor device packages formed in accordance with implementations of the invention. For example, in an embodiment, the communication package 506 comprises a die at least partially embedded in the core layer of the package substrate. The processor 504 is physically and electrically coupled to the board 502. In some implementations the at least one communication package 506 is also physically and electrically coupled to the board 502. In further implementations, the communication package 506 is physically and electrically coupled to another circuit board such as a card 508 (e.g. a daughter card), which is physically and electrically coupled to the board 502. In further implementations, the communication package 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication package 506 may be any of the semiconductor device packages that are formed in accordance with implementations of the invention. The communication package 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication packages 506. In an embodiment, one or more of the communication packages 506 comprises a die at least partially embedded in the core layer of the package substrate. For instance, a first communication package 506 may be dedicated to shorter range wireless communications such as Wi-Fi and Bluetooth and a second communication package 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the processor package comprises a die at least partially embedded in the core layer of the package substrate. In some implementations of the invention, the integrated circuit die of the processor includes one or more devices, such as transistors or metal interconnects. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In an embodiment, a package comprises a substrate having a core layer, wherein the core layer has a first core surface and a second core surface; a metal layer on each of the first core surface and the second core surface; a cavity within the core layer; an embedded active die embedded within the cavity; and an electromagnetic shield within the cavity between the core layer and the embedded active die. In an embodiment, the embedded active device is selected from the group consisting of an RF die, an application processor, memory chip, and a power amplifier. In an embodiment, the embedded active die is mounted on one of a first buildup layer on the first core surface and a second buildup layer on the second core surface. In an embodiment, the substrate has a land surface and a device-mounting surface opposite the land surface, and wherein the land surface is mounted to a PCB and a surface device is mounted on the device-mounting surface of the substrate. In an embodiment, the embedded active die is coupled to the surface device via internal routing. In an embodiment, the surface device is a passive device selected from the group consisting of a crystal oscillator, a capacitor, a resistor, an inductor, a transformer, a low-pass filter, and a high-pass filter. In an embodiment, the surface device is an active device selected from the group consisting of an RF die, an RF switch, an application processor, memory chip, and a power amplifier. In an embodiment, the package further comprises an embedded passive device embedded within the core layer. In an embodiment, the embedded passive device is a crystal oscillator. In an embodiment, the substrate further comprises additional build-up layers, wherein the number of build-up layers over the first core surface is equal to the number of buildup layers over the second core surface. In an embodiment, the substrate further comprises additional buildup layers, wherein the number of buildup layers over the first core surface is not equal to the number of buildup layers over the second core surface. In an embodiment, the package further comprises an overmold layer encompassing the device-mounting surface. In an embodiment, the package further comprises a conformal shield layer covering the overmold layer.

In an embodiment, a package comprises a substrate having a core layer and a plurality of buildup layers; and a crystal oscillator at least partially embedded within the core and mounted on one of the buildup layers. In an embodiment, the crystal oscillator extends through one or more buildup layers. In an embodiment, the crystal oscillator is fully embedded within the substrate. In an embodiment, the number of build-up layers over a first core surface of the core layer is equal to the number of buildup layers over a second core surface of the core layer. In an embodiment, the number of buildup layers over a first core surface of the core layer is not equal to the number of buildup layers over a second core surface of the core layer. In an embodiment, the substrate has a land surface mounted to a PCB and a device-mounting surface having a passive component mounted thereon. In an embodiment, the package further comprises an active device mounted on the device-mounting surface of the substrate. In an embodiment, the package further comprises an overmold layer encompassing the device-mounting surface. In an embodiment, the package further comprises a conformal shield layer covering the overmold layer.

In an embodiment, an apparatus comprises a PCB; a package having a core layer and an embedded active die embedded within the core layer, wherein the package is mounted on the PCB; and a crystal oscillator mounted on the PCB. In an embodiment, the crystal is coupled to the package via routing in the PCB.

In an embodiment, a method comprises providing a core having a first core surface and a second core surface, wherein a metal layer is formed on each of the first core surface and the second core surface; drilling a cavity in the core layer; embedding at least a portion of a component within the cavity; and forming one or more build-up layers over each of the first core surface and the second core surface, wherein the component is mounted on one of the build-up layers. In an embodiment, the component is an active die. In an embodiment, the method further comprises depositing a metal shield on the surfaces of the cavity to form a shielded cavity. In an embodiment, the component is a crystal oscillator. In an embodiment, the core layer and buildup layers form a substrate of a package having a land surface and a device-mounting surface, and wherein the land surface is mounted on a PCB and one or more additional components are mounted on the device-mounting surface. In an embodiment, the method further comprises forming an overmold layer on the device-mounting surface encompassing the additional components. In an embodiment, the method further comprises forming a conformal shield layer over the overmold layer. In an embodiment, the method further comprises mounting a crystal oscillator on the PCB.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A package, comprising:
   a substrate having a core layer with a first core surface and an opposite second core surface;
   a metal layer on the first core surface and the second core surface;
   a first buildup layer over the first core surface and the metal layer, the first buildup layer having a first insulating layer, a first plurality of conductive vias disposed therein, and a first plurality of conductive lines disposed thereon;
   a second buildup layer over the second core surface and the metal layer, the second buildup layer having a second insulating layer, a second plurality of conductive vias formed therein and a second plurality of conductive lines disposed thereon;
   a cavity within the core layer;
   a plurality of conductive through vias extending through said core layer and coupling said first plurality of conductive lines to said second plurality of conductive lines; and
   an embedded active die embedded within the cavity.

2. The package of claim 1, further comprising an electromagnetic shield within the cavity between the core layer and the embedded active die.

3. The package of claim 1, wherein the embedded active device is selected from the group consisting of an RF die, an application processor, memory chip, and a power amplifier.

4. The package of claim 1, a second core surface, and wherein the embedded active die is mounted on one of the first buildup layer on the first core surface or the a second buildup layer on the second core surface.

5. The package of claim 1, wherein the substrate has a land surface and a device-mounting surface opposite the land surface, and wherein the land surface is mounted to a Printed Circuit Board (PCB) and a surface device is mounted on the device-mounting surface of the substrate.

6. The package of claim 5, wherein the surface device is a passive device selected from the group consisting of a crystal oscillator, a capacitor, a resistor, an inductor, a transformer, a low-pass filter, and a high-pass filter.

7. The package of claim 5, wherein the surface device is an active device selected from the group consisting of an RF die, an RF switch, an application processor, memory chip, and a power amplifier.

8. The package of claim 1, further comprising an embedded passive device embedded within the core layer.

9. The package of claim 8, wherein the embedded passive device is a crystal oscillator.

10. The package of claim 4, wherein the substrate further comprises additional build-up layers, wherein the number of build-up layers over the first core surface is equal to the number of buildup layers over the second core surface.

11. The package of claim 4, wherein the substrate further comprises additional buildup layers, wherein the number of buildup layers over the first core surface is not equal to the number of buildup layers over the second core surface.

12. The package of claim 5, further comprising an overmold layer encompassing the device-mounting surface.

13. The package of claim 12, further comprising a conformal shield layer covering the overmold layer.

14. A package, comprising:
   a substrate having a core layer with a first core surface and an opposite second core surface;
   a first buildup layer over the first core surface, the first buildup layer having a first insulating layer, a first plurality of conductive vias disposed therein, and a first plurality of conductive lines disposed thereon;
   a second buildup layer over the second core surface, the second buildup layer having a second insulating layer, a second plurality of conductive vias formed therein and a second plurality of conductive lines disposed thereon;

a plurality of conductive through vias extending through said core layer and coupling said first plurality of conductive lines to said second plurality of conductive lines; and a crystal oscillator at least partially embedded within the core layer and mounted on one of the first or second buildup layers.

15. The package of claim 14, wherein the crystal oscillator extends through one or more buildup layers.

16. The package of claim 14, wherein the crystal oscillator is fully embedded within the substrate.

17. The package of claim 14, wherein the number of buildup layers over a first core surface of the core layer is equal to the number of buildup layers over a second core surface of the core layer.

18. The package of claim 14, wherein the number of buildup layers over a first core surface of the core layer is not equal to the number of buildup layers over a second core surface of the core layer.

19. The package of claim 14, wherein the substrate has a land surface mounted to a PCB and a device-mounting surface having a passive component mounted thereon.

20. The package of claim 19, further comprising an active device mounted on the device-mounting surface of the substrate.

21. An apparatus, comprising:
a PCB;
a package having a core layer with a first core surface and an opposite second core surface;
a first buildup layer over the first core surface, the first buildup layer having a first insulating layer, a first plurality of conductive vias disposed therein, and a first plurality of conductive lines disposed thereon;
a second buildup layer over the second core surface, the second buildup layer having a second insulating layer, a second plurality of conductive vias formed therein and a second plurality of conductive lines disposed thereon;
an embedded active die embedded within the core layer; and
a plurality of conductive through vias extending through said core layer and coupling said first plurality of conductive lines to said second plurality of conductive lines, wherein the package is mounted on the PCB; and
a crystal oscillator mounted on the PCB.

22. The apparatus of claim 21, wherein the crystal is coupled to the package via routing in the PCB.

23. A method, comprising:
providing a core layer having a first core surface and a second core surface;
forming a plurality through vias through said core layer forming a cavity in the core;
forming a metal layer on the first core surface and the second core surface and in the plurality of through vias to form a plurality of conductive through vias;
embedding at least a portion of a component within the cavity; and
forming a first buildup layer on the first core surface and the metal layer and a second buildup layer on a second core surface and the metal layer, the first buildup layer having a first insulating layer, a first plurality of conductive vias disposed therein, and a first plurality of conductive lines disposed thereon and the second buildup layer having a second insulating layer, a second plurality of conductive vias formed therein and a second plurality of conductive lines disposed thereon and wherein said plurality of conductive through vias couple said plurality of first conductive lines to said plurality of second conductive lines, and wherein the component is coupled to one of the build-up layers.

24. The method of claim 23, wherein the component is an active die.

25. The method of claim 23, wherein a metal layer is formed on each of the first core surface and the second core surface.

26. The method of claim 23, further comprising depositing a metal shield on the surfaces of the cavity to form a shielded cavity.

27. The method of claim 23, wherein the component is a crystal oscillator.

28. The method of claim 23, wherein the core layer and buildup layers form a substrate of a package having a land surface and a device-mounting surface, and wherein the land surface is mounted on a PCB and one or more additional components are mounted on the device-mounting surface.

29. The method of claim 28, further comprising mounting a crystal oscillator on the PCB.

* * * * *